United States Patent [19]

Siano

[11] Patent Number: 4,560,217
[45] Date of Patent: Dec. 24, 1985

[54] CHIP CARRIER CONNECTOR

[75] Inventor: Frank S. Siano, Monroe Township, Middlesex County, N.J.

[73] Assignee: Thomas & Betts Corporation, Raritan, N.J.

[21] Appl. No.: 524,044

[22] Filed: Aug. 17, 1983

[51] Int. Cl.$^4$ .......................................... H01R 13/62
[52] U.S. Cl. ............................ 339/14 R; 339/17 CF; 339/75 MP
[58] Field of Search ............ 339/17 CF, 14 R, 75 M, 339/75 MP, 176 M, 176 MP

[56] References Cited

U.S. PATENT DOCUMENTS

| | | | |
|---|---|---|---|
| 109,330 | 11/1870 | Maddox | 292/256.5 |
| 1,050,265 | 1/1913 | Crone | 220/259 |
| 1,645,476 | 10/1927 | Fell et al. | 188/130 |
| 2,016,606 | 10/1935 | Krueger | 220/82 |
| 2,927,295 | 3/1960 | Sitz | 339/18 |
| 4,130,327 | 12/1978 | Spaulding | 339/17 |
| 4,220,383 | 9/1980 | Scheingold et al. | 339/17 |
| 4,278,311 | 7/1981 | Scheingold et al. | 339/17 |
| 4,354,720 | 10/1982 | Bakermans | 339/91 |
| 4,378,139 | 3/1983 | Griffin et al. | 339/75 |
| 4,381,131 | 4/1983 | Demnianivk | 339/75 |
| 4,433,886 | 2/1984 | Cassarly et al. | 339/75 MP |
| 4,456,318 | 6/1984 | Shibata et al. | 339/17 CF |
| 4,460,223 | 7/1984 | Brown et al. | 339/17 CF |
| 4,502,747 | 3/1985 | Bright et al. | 339/75 |

FOREIGN PATENT DOCUMENTS 188648 1/1937 Switzerland .

OTHER PUBLICATIONS

Bruder, "Insertion/Extraction Test Socket", 10/70, vol. 13, No. 5, p. 1265, IBM Tech. Disc. Bull.
Eames, "Components Update: IC Sockets & Chip Carriers", 7/18/1983, Electronic Engineering Times, p. 2.

Primary Examiner—John McQuade
Attorney, Agent, or Firm—Robert M. Rodrick; Salvatore J. Abbruzzese

[57] ABSTRACT

A semiconductive chip carrier connector for mounting to a printed circuit board. The connector includes a pair of oppositely facing levers, hingedly attached to opposite sides of the connector body. The first lever engages the chip carrier and urges it into engagement with contacts supported by the connector body. The second lever engages the first lever and urges the first lever into contact with the chip carrier.

14 Claims, 6 Drawing Figures

CHIP CARRIER CONNECTOR

FIELD OF THE INVENTION

The present invention relates generally to an electrical connector for accommodating a circuit element carrier such as an integrated circuit chip carrier, and more specifically relates to a hold down member for securing the chip carrier in electrical contact in the connector.

BACKGROUND OF THE INVENTION

The importance of integrated circuit semiconductors in the electronic industry is well known. These circuits have revolutionized the industry. Employed in miniaturized form and made into chips, these circuits can be utilized in great numbers in very little space, such as on printed circuit boards.

Integrated circuits (IC) are commonly packaged by mounting the semiconductor chip on a rectangular substrate or carrier having conductive elements on one side which extend from the chip to the marginal edge of the substrate. In order to connect the chip carrier to the printed circuit board an electrical connector is employed which provides electrical connection between the conductive elements of the chip carrier and conductive traces of the printed circuit board. Such chip carrier connectors are shown for example in U.S. Pat. Nos. 4,378,139; 4,220,383; and 4,381,131.

Typically, these connectors include a rectangular (usually square) body or housing which supports, around the permetrical edge thereof, a plurality of spring contacts. The chip carrier is receivable into the body, and the conductive elements thereon engage the spring contacts. The contacts include extending portions which connect to the conductive traces in the printed circuit board. In order to provide adequate electrical connection between the chip carrier and the spring contacts, it is necessary to provide some means to assure that the spring contacts will be continuously urged against the conductive elements of the chip carrier with a force sufficient to maintain such electrical contact.

Devices commonly used to maintain such electrical contact are lids which are moved to bear against the chip carrier and urge it into resilient electrical contact with the spring contacts. These lids, typically hinged at one end of the body, may also include a separate spring element to further bear against the chip carrier. Such hinged lids are shown, for example, in the above-mentioned U.S. Pat. Nos. 4,378,139 and 4,220,383.

When employing a chip carrier of conventional dimensions, the carrier may include a great number of conductive elements or traces thereon. Each element would individually contact a corresponding one of an identical number of spring contacts in the connector. Each spring contact exerts a force against the connector upon insertion. The force may vary from contact to contact depending on construction, thickness and material composition. With contacts numbering in the range of 48 to 68 or lower, only a relatively light force is needed to urge the chip carrier into electrical connection with the contacts. However, when the number of conductive elements of the chip carrier, and correspondingly the number of contacts in the connector is increased to as many as 132 or more, as is now desired for increased capacity, the force needed to urge the chip carrier into engagement with the contacts is greatly increased. In fact, the applied force needed may be so great as to render insertion by the user difficult.

Hinged lids or levers would of course reduce the difficulty of insertion as the lever aids in rendering a greater applied force to the carrier upon closing, based on simple lever principles. However, to provide an effective applied force sufficient to close the lid and urge the carrier into engagement with the contacts, the length of the lid would have to be greater then that which is acceptable for the space provided.

It is accordingly desirable to provide an urging mechanism which would provide sufficient effective force to the chip carrier and yet be of an acceptable size.

SUMMARY OF THE INVENTION

It is an object of the present invention to provide a suitable electrical connector which will support a relatively high number of electrical contacts for connection with a chip carrier. The connector includes a device for urging the carrier into electrical connection with the contacts.

In the efficient attainment of the foregoing and other objects, the invention looks toward providing a circuit element connector comprising a body having a central cavity and supporting a plurality of electrical spring contacts therearound. A first arm member engages the circuit element and urges it into electrical connection with the contacts. A second arm member engages the first arm member and urges it into contact with the circuit element.

In a particularly employed embodiment the arm members are hinged covers wich overlie the central cavity, with the second arm member overlying the first arm member.

Other objects and features of the invention will be evident from the following detailed description of the preferred embodiment of the present invention.

DETAILED DESCRIPTION OF THE PREFERRED EMBODIMENT

Figure 1:
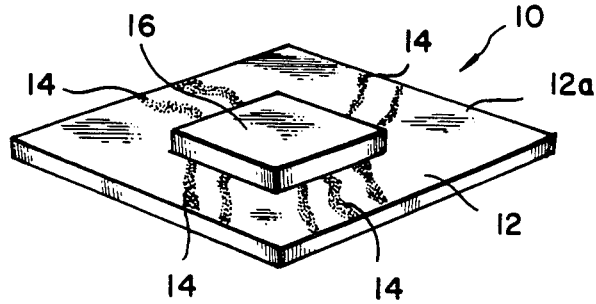
FIG. 1 shows, in bottom perspective view, a chip carrier including an integrated circuit semiconductive chip thereon.

Referring to FIG. 1, circuit element 10 is shown which includes a chip carrier 12 comprising a thin flat insulative substrate having a plurality of electrically conductive portions or traces 14 thereon. Chip carrier 12 is substantially square in shape, and the conductive traces 14 extend on one surface 12a from the central region thereof to the marginal edge. An integrated circuit semiconductive chip 16 is mounted in approximately a central location on the bottom surface 12a of carrier 12. The traces 14 extend from the chip 16 and are electrically connected thereto. As the particular patterns of traces 14 on the carrier 12 may vary according to the content of the chip 16, traces 14 as shown are considered as representative.

Figure 4:
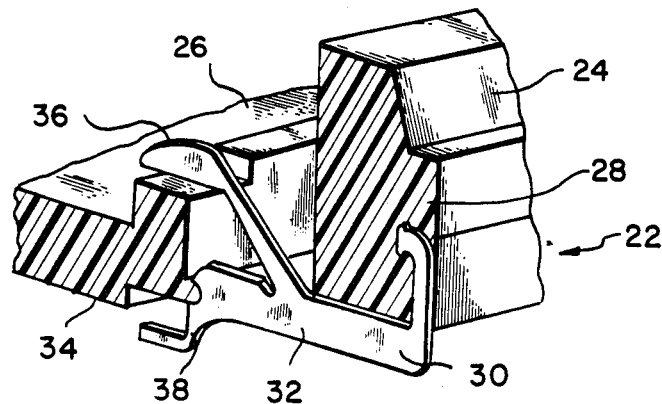
FIG. 4 is a sectional fragmented showing of a portion of the connector body of FIGS. 2 and 3 supporting thereon one of a plurality of electrical spring contacts.
Figure 2:
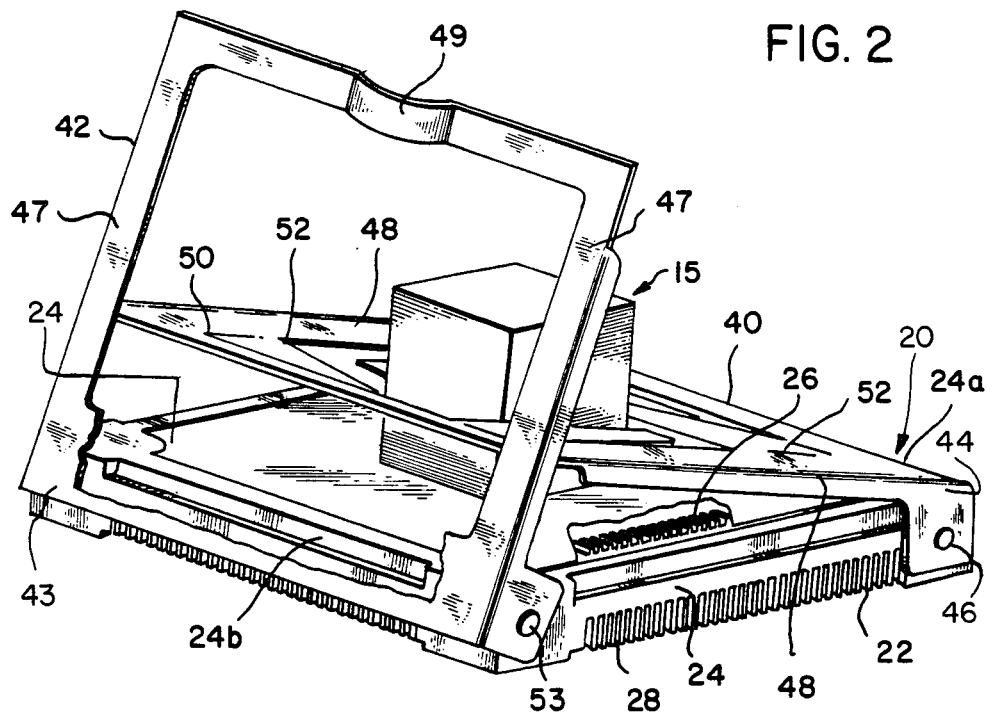
FIGS. 2 and 3 show in top and bottom perspective views respectively, the chip carrier connector of the present invention with the lids in non-engaged position.
Figure 3:
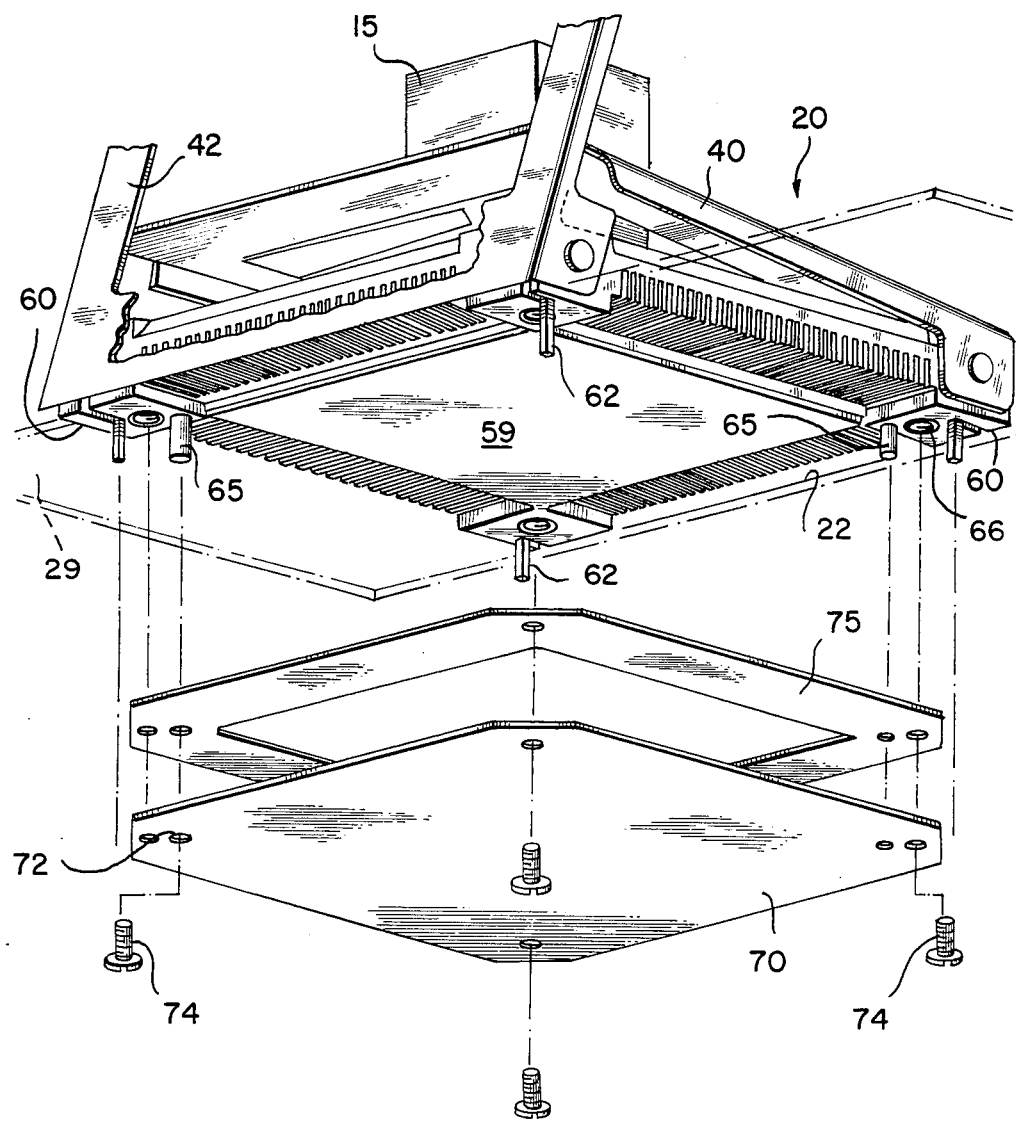
Figure 5:
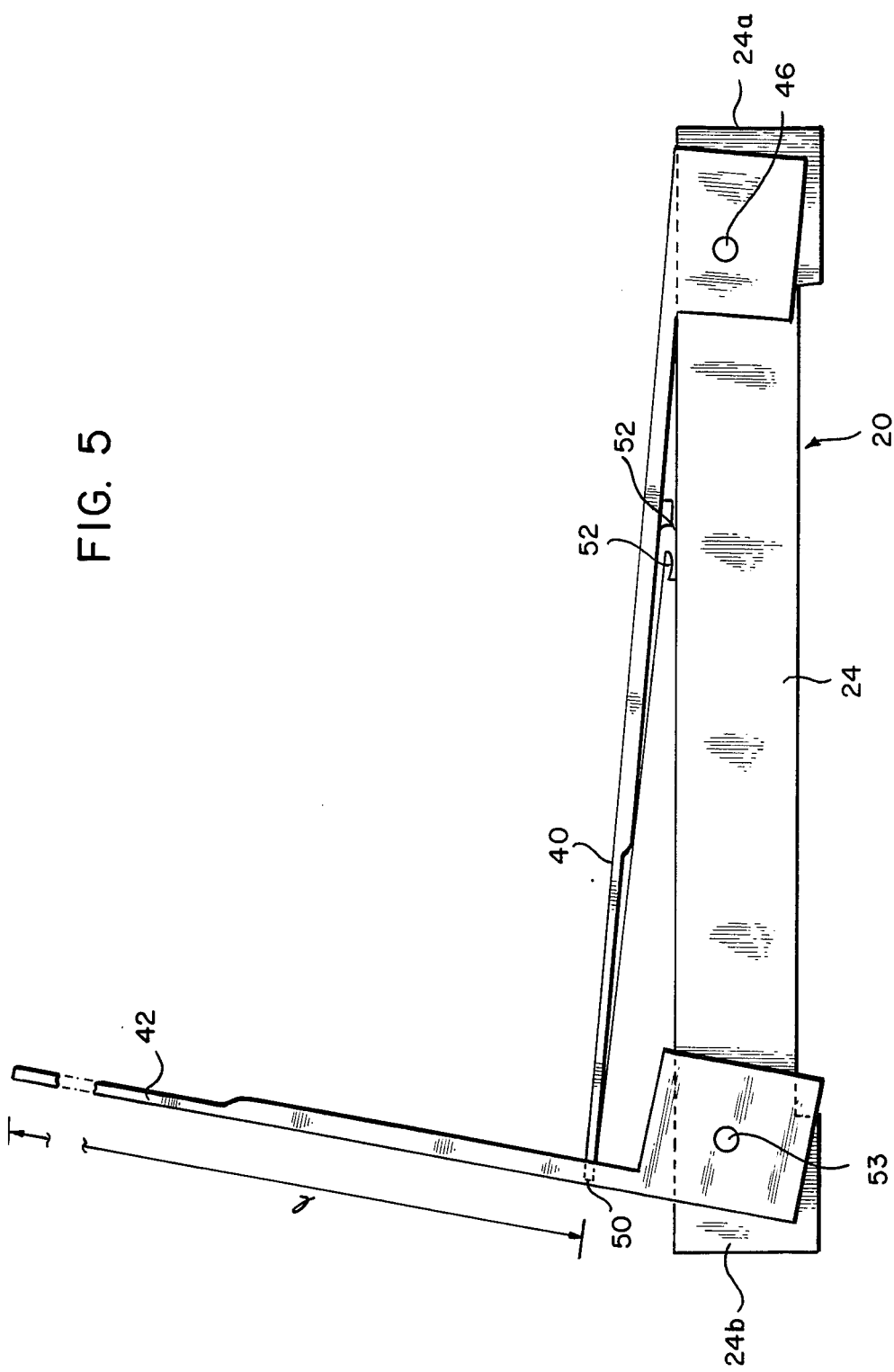
FIGS. 5 and 6 show in side plan views the connector of FIGS. 2 and 3 with the lids in open and engaged position, respectively.

Referring now to FIGS. 2–4 electrical connector 20 is shown comprising a substantially square body 22 which is constructed typically of an insulative plastic, having four side walls 24. Body 22 defines between side walls 24, a central cavity 26, which accommodates and houses therein circuit element 10. As illustrated in FIGS. 2 and 3, circuit element 10 includes thereon, shown by way of example in schematic fashion, a heat sink 15 which is positioned over chip 16 to dissipate the heat that is generated during use. The size and shape of heat sink 15 may vary depending on the heat generated by the particular circuit element 10 employed. With certain connector and heat sink construction, power dissipation may be in the range of three to four watts.

Body side walls 24 each include a plurality of slotted channels 28 each opening into the central cavity 26. Each slotted channel 28 receives and supportably separates an electrically conductive contact 30 (FIG. 4). In the present illustrative embodiment each side wall is segmented by thirty-three channels, thus providing a 132 contact connector. While the present invention is particularly useful with a connector having contacts numbering in this range, the invention may also be employed with connector having a lower or higher number of contacts.

As particularly shown in FIG. 4, each contact 30 is supported by a portion of side wall 24 in an individual channel 28. Each contact 30 includes a main body portion 32 which secures the contact 30 to the body 22. An inclined spring element 34 extends in cantilevered fashion from the main body portion 32 into the central cavity 26. A rounded upper portion of the cantilever element 34 forms a contact portion 36 which serves to make electrical contact with an individual trace 14 of carrier 12 upon insertion of carrier 12 into connector 20. As will be described hereinafter, cantilever element 34 is resiliently deflectable upon insertion of carrier 12 into cavity 26. Contact 30 further includes an projecting portion 38 which extends downwardly through the bottom surface of body 22. Projecting portion 38 serves to make exterior electrical connection with a conductive element on a printed circuit board 29 shown in phantom in FIG. 3 to which electrical connection of connector 20 is ultimately made. Such connection may for example be made by flow soldering or other conventional means.

Referring again to FIGS. 2 and 3, connector 20 further includes a pair of oppositely oriented plate-like levers 40 and 42 which serves as closing lids for connector 20. Lever 40 is a centrally-opened, square member having a base member 44 hingedly secured to one side wall 24a of body 22 at coaxial hinge pins 46 at opposites extents of base member 44. A pair of arm members 48 extend from hinged base member 44 toward opposite side wall 24b. A distal transverse bridging member 50 connects the distal extents of arm members 48. Thus base member 44, arm members 48 and bridging member 50 form a four-sided, open frame which substantially spans the upper portion of connector 20.

Extending downwardly from each side member of lever 40 is a cantilever spring 52. The four springs 52 are arranged in a head-to-tail configuration, around the central opening of the lever 40, the secured extents of one spring being adjacent to an unsecured extent of another. With the chip carrier 12 inserted into cavity 26, the lever 40 may be closed down over and onto the carrier 12. The upwardly extending heat sink 15 is accommodated by the open frame configuration of lever 40.

Lever 42 is of similar construction to that of lever 40, and includes a base member 43 hingedly secured to body 22 adjacent a side wall 24b opposite side wall 24a. A pair of arm members 47 extend from hinged base member 43 toward side wall 24a. A distal bridging member 49 connects the distal extents of arm members 47 to form a four-sided open frame. Coaxial hinge pins 53 secure base member 43 of lever 42 to connector 20.

With reference to FIGS. 3–6, the operation of connector 10 can be described.

Initially the connector 20 is in the open position with both levers 40 and 42 fully upright. The carrier 12 is positioned in the central cavity 26 of connector 20 so that the carrier 12 is seated on the contact portions 36 against the bias of the cantilever spring contacts 30. The chip 16 is placed face down from view shown in FIG. 1 in the connector 20 so that the traces 14 engage the contacts 30. The first lever 40 is brought down over carrier 12 until one or more of the springs 52 bears against the upper surface of carrier 12. Further downward movement of the lever 40 and thus the carrier 12 will be resisted by the force exerted by the spring contacts 30 against the carrier 12. This force is sufficient to prevent further reasonable manual depressoin of the lever 40. In this position (shown in FIG. 5) the arm members 47 of the second lever 42 will rest against or be propped up by the distal bridging member 50 of lever 50 which is contacting the lever 42 below the perpendicular intersection of the two levers. Downward pivotal movement of the second lever 42 will force the first lever 40 slidingly down onto the chip carrier 12. As the first lever 40 moves downward upon depression of the second lever 42, the length between the distal end of lever 42 and the intersection of levers 40 and 42 will increase. By continuously increasing this length, which occurs as a result of the progressive sliding downward movement of lever 40, the force applied by the first lever 40 to the chip carrier 12 will effectively increase, thus allowing the installer to overcome the spring force of the contacts 30 and provide for easy manual insertion of the carrier 12 into the cavity 26.

Figure 6:
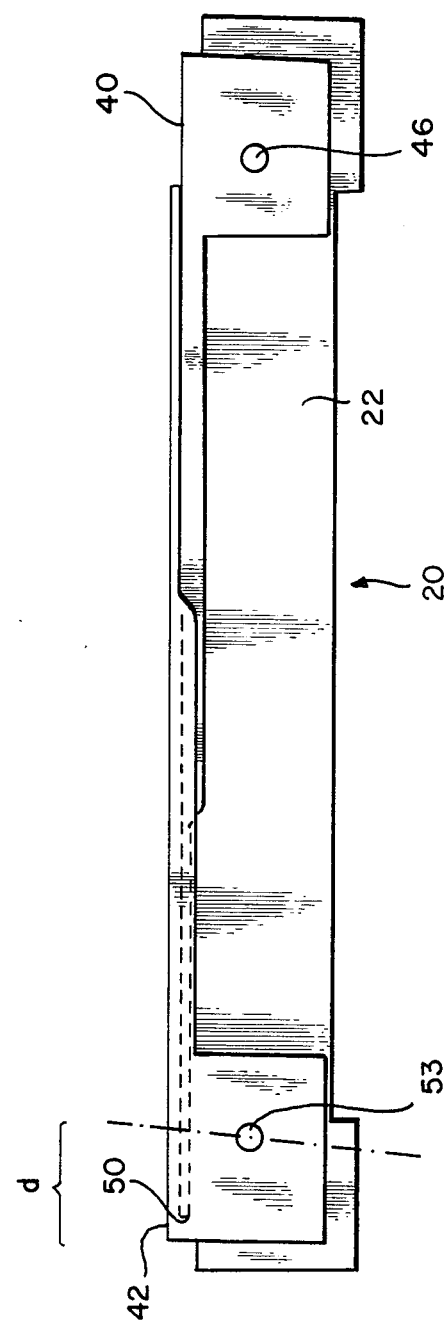

As shown in FIG. 6, connector 10 is in closed position with first lever 40 overlying by engaging first lever 40. In this position, chip carrier 12 is sufficiently urged against the bias of the spring contacts 30 to provide suitable electrical connection. Such urging is enhanced by the springs 52 of lever 40 which in closed position further bias carrier 12 against contacts 30.

A further feature of the present invention is shown in FIG. 6. With the lever 40 and 42 closed in overlapping position over chip carrier 12, there will be sufficient urging of the carrier 12 against contacts 30 to provide adequate electrical connection. It is important to maintain this continuous urging by assuring that the lever 40 and 42 remain in a closed position over the chip carrier 12.

Lever 40 is constructed to have an extent d, which, when in the closed position, will extend beyond the hinge pin 53 of lever 42. By extending beyond the hinge pin, and thus beyond the center of the hinging mechanism of lever 42, the distal bridging member 50 will exert upward force (due to the spring biases of both springs 52 and contacts 30) against the rear portion of lever 40. Since such force is extended upwards on one side of hinge pin 53 it will force by means of a moment the other side down into closed position against lever 40. Construction in this manner will serve as a latch preventing inadvertent opening of the levers 40 and 42. The connector 20 can be opened normally by lifting the distal bridging member 40 of lever 42.

Referring again to FIG. 3, a still further feature of the present invention is shown. It is often desirable to make a ground connection between the printed circuit board 29 which supports connector 20, and certain ground traces or pads (not shown) on chip 16 or carrier 12. In order to provide such a grounding path, connector 20 is designed to place lever 40 and 42 in the ground path and thus provide continuous ground between the printed circuit board 29 and chip 16.

Connector 20 has on the undersurface 59 thereof four slots 60, one at each corner. Slots 60 accommodate ground contacts 62. Each ground contact extends through the undersurface 59 of connector 20 for ultimate connection to ground traces on the printed circuit board. The upper portion of the ground contacts engage with and are connected to the distal bridging member 50 of lever 40, when in the closed position. As levers 40 and 42 are constructed of conductive metal a grounding path will be established between the ground traces of the printed ciruit board and levers 40 and 42. Springs 52 which are integrally formed with lever 40 extend down and contact chip carrier 12 when the lever 40 and 42 are in a closed position. The ground path will continue to the selected traces of carrier 12 which are in contact with the spring 52.

A yet further feature of the present invention is shown in FIG. 3. Connector 20 includes on the undersurface 59 thereof a pair of mounting posts 65 spaced at diagonally opposite corners of body 22. Posts 65 extend through aligned openings in printed circuit board 29 to properly position connector 20 on printed circuit board 29. In order to securely anchor connector 20 to printed circuit board 29 prior to the flow soldering operation, a back up plate 70 is positioned adjacent the one side of printed circuit board 29, opposite the side to which connector 20 is mounted. Back up plate 70, which is preferably made of steel, is a square plate approximately the size of the undersurface 59 of connector 20 and includes four holes 72 one at each corner thereof. Holes 72 accommodate binding screws 74 which are inserted through holes 72 and up through similarly aligned openings (not shown) in printed circuit board 29. The undersurface 59 of connector 20 includes four screw threaded insert openings 66, one at each corner thereof which are aligned with holes 72 of plate 70. Openings 66 receive binding screws 74 thus securing connector 20 to plate 70 with printed circuit board 29 fixedly supported therebetween. In preferred form an insulative gasket 75 is interposed between plate 70 and printed circuit board 29.

The present invention further contemplates placing the steel back plate 70 in the grounding path of connector 20. In certain application it may be necessary to provide an electrical shield for the chip 16. Such a shield may be provided by the steel back plate 70. As previously set forth, grounding contacts 62 in electrical contact with lever 40 thus placing the levers 40 and 42 at ground potential. By placing the back plate 70 in electrical connection with the levers 40 or 42 the back plate 70 will also be at ground potential. The back plate 70 can be connected to one of levers 40 or 42 in a variety of ways. One method for example would be to extend the length of the binding screws 74 so that they contact lever 40 in closed position thus establishing electrical connection therebetween.

Having described the preferred embodiment of the invention together with its attendant advantages herein, it should be appreciated that other various modifications may be made without departing from the contemplated scope of the invention. Accordingly, the particularly described preferred embodiment is intended to be illustrative and not limited thereto. The true scope of the invention is set forth in the following claims.

I claim:

1. A connector for connection to a circuit element carrier comprising:
    a rectangular body having two pairs of opposed upstanding sides, each side having an exterior edge, said body defining interiorly of said sides a central cavity for receipt of said circuit element carrier;
    a plurality of electrical spring contacts supported on said sides of said body and extending into said central cavity;
    a first rectangular plate-like arm member pivotally supported on one of said sides and having a distal extent extending toward the opposite side thereof thereby spanning said central cavity, said first arm member being supported for pivotal movement into overlying engagement with said circuit element carrier for urging said circuit element carrier into resilient electrical engagement with said spring contacts;
    a second rectangular plate-like arm member pivotally supported on said opposite side at a location interior of an exterior edge thereof for pivotal movement into overlying engagement with said first arm member for urging said first arm member into engagement with said circuit element carrier, said distal extent of said first arm member being disposed for positioning exteriorly of said pivotal support location of said second arm member.

2. The connector of claim 1 wherein said first and second arm members include a central opening for accessing said circuit element carrier.

3. The connector of claim 1 wherein said spring contacts include cantilever portions extending into said central cavity for resilient engagement with said circuit element carrier.

4. The connector of claim 1 wherein said first arm member includes a spring extending toward said central cavity for resiliently engaging said circuit element carrier.

5. The connector of claim 4 wherein said spring resiliently urges said first arm member against said second arm member.

6. The connector of claim 1 further comprising a second set of contacts supported by said body in electrical connection with said arm members.

7. The connector of claim 6 when said second set of contacts are at ground potential.

8. A device for connecting an integrated circuit package to a printed circuit board comprising:
    a multi-sided housing defining between the sides thereof a central opening for receiving said integrated circuit package;
    a plurality of spring contacts supported on said sides of said housing, each of said contacts including an upper portion extending into said opening for engagement with a conductive element on said package and a lower portion which extends beyond said housing for connection with said printed circuit board;

a first plate-like lever hingedly connected adjacent one end thereof to a first hinged connection location on one side of said housing for pivotal movement into resilient engagement with said package and adapted to overlie said central opening;

a second plate-like lever hingedly connected adjacent one end thereof to a second hinged-connection location on the side of said housing opposite said one side for pivotal movement and for sliding contact with said first lever and adapted to overlie said first lever for supporting said first lever in resilient contact with said package wherein said first and second plate-like levers includes a central opening therein for accessing said package; and holding means for maintaining said second lever in said position overlying said first lever, said first plate-like lever having a distal portion opposite said first hinged connection location, extending beyond said second hinged connection location of said second plate-like lever.

9. The device in accordance with claim 8 wherein said upper portion of each of said spring contacts is a cantilever member having a contact edge extending into said cavity for electrical engagement with said package.

10. The device in accordance with claim 8 further including a second set of electrical contacts electrically connected to one of said first and second plate-like levers.

11. The device in accordance with claim 10 wherein said second set of contacts are grounded.

12. The device in accordance with claim 11 wherein said housing is adapted to be mounted on one surface of said printed circuit board.

13. The device in accordance with claim 12 further comprising a metallic back plate adapted to be mounted to the surface of said printed circuit board opposite to said one surface for supporting said printed circuit board in fixed position between said housing and said back plate.

14. The device in accordance with claim 13 wherein said metallic back plate is electrically connected to said one of said first or second levers.

* * * * *